United States Patent
Hanamachi

(10) Patent No.: US 10,279,441 B2
(45) Date of Patent: May 7, 2019

(54) METHOD OF MANUFACTURING PLATE WITH PASSAGE, PLATE WITH PASSAGE, TEMPERATURE ADJUSTMENT PLATE, COLD PLATE, AND SHOWER PLATE

(75) Inventor: Toshihiko Hanamachi, Kanagawa (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 850 days.

(21) Appl. No.: 13/808,783

(22) PCT Filed: Jul. 6, 2011

(86) PCT No.: PCT/JP2011/065507
§ 371 (c)(1),
(2), (4) Date: Jan. 7, 2013

(87) PCT Pub. No.: WO2012/005305
PCT Pub. Date: Jan. 12, 2012

(65) Prior Publication Data
US 2013/0112383 A1    May 9, 2013

(30) Foreign Application Priority Data
Jul. 9, 2010    (JP) .................................. 2010-157235

(51) Int. Cl.
*F28F 3/14*        (2006.01)
*B23P 15/26*       (2006.01)
(Continued)

(52) U.S. Cl.
CPC .......... *B23P 15/26* (2013.01); *C23C 16/4586* (2013.01); *C23C 16/45565* (2013.01);
(Continued)

(58) Field of Classification Search
CPC ............... H01L 21/02; H01L 21/67109; C23C 16/4586; C23C 16/45565; F28F 3/12; B23P 15/26
(Continued)

(56) References Cited

U.S. PATENT DOCUMENTS 5,579,534 A * 11/1996 Itoh .......................... C23C 4/02
                                                            428/547
6,129,145 A    10/2000  Yamamoto et al.
(Continued)

FOREIGN PATENT DOCUMENTS

CN    101631896 A    1/2010
JP    62-172977 U    11/1987
(Continued)

OTHER PUBLICATIONS

Office Action dated Jan. 17, 2014, issued for the corresponding Korean patent application No. 10-2013-7000378.
(Continued)

*Primary Examiner* — Claire Rojohn, III
(74) *Attorney, Agent, or Firm* — Locke Lord LLP

(57) ABSTRACT

A plate with a passage and the like capable of shortening a process time than a previous one and of suppressing leakage from or contamination to the passage are provided. The plate with the passage is a plate in which the passage for causing a fluid to circulate therein is formed, and includes a body plate formed of a metal or an alloy and in which a groove serving as the passage is provided, a cover plate that covers the groove, and a deposition layer that is formed such that metal or alloy powder is accelerated with a gas and is sprayed on the body plate and the cover plate in a solid phase, and covers the cover plate.

6 Claims, 14 Drawing Sheets

(51) Int. Cl.
*C23C 16/455* (2006.01)
*C23C 16/458* (2006.01)
*F28F 3/12* (2006.01)
*H01L 21/67* (2006.01)
*C23C 24/04* (2006.01)

(52) U.S. Cl.
CPC ............. *C23C 24/04* (2013.01); *F28F 3/12* (2013.01); *H01L 21/67109* (2013.01); *Y10T 29/4935* (2015.01)

(58) Field of Classification Search
USPC ............................. 165/170, 104.19, 104.33
See application file for complete search history.

(56) References Cited

U.S. PATENT DOCUMENTS

| | | | |
|---|---|---|---|
| 7,480,992 B2* | 1/2009 | Okamoto | B23K 20/122 165/170 |
| 8,025,921 B2 | 9/2011 | Miyamato et al. | |
| 2002/0153130 A1 | 10/2002 | Okamoto et al. | |
| 2004/0040933 A1 | 3/2004 | Kanno et al. | |
| 2008/0298975 A1 | 12/2008 | James et al. | |
| 2010/0073883 A1* | 3/2010 | Miyamato | C23C 24/04 361/709 |

FOREIGN PATENT DOCUMENTS

| | | | | |
|---|---|---|---|---|
| JP | 11-040715 | A | 2/1999 | |
| JP | 11-074614 | A | 3/1999 | |
| JP | 2002-248584 | A | 9/2002 | |
| JP | 2002-257490 | A | 9/2002 | |
| JP | 2006-299294 | A | 11/2006 | |
| JP | 2006-329439 | A | 12/2006 | |
| JP | 2008-231486 | A | 10/2008 | |
| JP | 2008-274352 | A | 11/2008 | |
| JP | 2009-291793 | A | 12/2009 | |
| JP | 2010-123712 | A | 6/2010 | |
| KR | 10-2007-0088368 | A | 8/2007 | |
| KR | 100856592 | B * | 9/2008 | ............. H01L 21/02 |
| KR | 100856592 | B1 * | 9/2008 | ............. H01L 2/02 |
| TW | 506874 | B | 10/2002 | |

OTHER PUBLICATIONS

Kazuhiko Sakaki, "Overview of cold spray technology and cold sprayed light metals coatings," Journal of Japan Institute of Light Metals, vol. 56, No. 7, 2006, pp. 376-385.
International Search Report dated Sep. 20, 2011, issued for PCT/JP2011/065507.
Office Action dated Nov. 4, 2014, issued for the corresponding Chinese patent application No. 201180030775.8.
Supplementary European Search Report dated Jul. 19, 2017, issued for the European patent application No. 11803639.1.

* cited by examiner

METHOD OF MANUFACTURING PLATE WITH PASSAGE, PLATE WITH PASSAGE, TEMPERATURE ADJUSTMENT PLATE, COLD PLATE, AND SHOWER PLATE

FIELD

The present invention relates to a method of manufacturing a plate with a passage, a plate with a passage, a temperature adjustment plate, a cold plate, and a shower plate used for adjustment of a temperature of a substrate, supply of a gas, and the like in a process of manufacturing a semiconductor, a liquid crystal display device, an optical disk, and the like.

BACKGROUND

In various substrate processes of manufacturing a semiconductor, a liquid crystal display device, an optical disk, and the like, a temperature adjustment plate (a cold plate and the like) that controls a temperature of the substrate, or a shower plate that supplies a gas having a predetermined component to the substrate is used. These temperature adjustment plate and shower plate typically have a structure in which a passage that causes a heating medium and a gas to circulate therein is provided inside a metal plate made of aluminum, an aluminum alloy, and the like (for example, see Patent Literatures 1 to 3).

Such a plate with a passage is conventionally manufactured such that the passage is formed on a metal plate body by means of machining and the like, another plate that seals the passage (for example, a keep plate) is layered with a passage side of the metal plate body, and both plates are joined or adhered by means of a welding processing, brazing, or an adhesive.

CITATION LIST

Patent Literature

Patent Literature 1: Japanese Utility Model Application Laid-open No. 62-172977
Patent Literature 2: Japanese Patent Application Laid-open No. 2006-329439
Patent Literature 3: Japanese Patent Application Laid-open No. 2006-299294

SUMMARY

Technical Problem

However, according to such a conventional manufacturing method, setting of a filler metal, brazing, or setting of filler for welding takes time, and therefore, many manufacturing processes are required. Also, in welding, high-temperature heat is applied to a base material. Therefore, leakage may be caused to the passage due to irregularity, an undercut, a warp of the base material, and the like caused by heat distortion. Meanwhile, when brazing or an adhesive is used, a component such as the filler metal and the like, other than the base material, may flow into the passage, and this may cause contamination to the passage.

The present invention has been made in view of the foregoing, and a purpose of the present invention is to provide a method of manufacturing a plate with a passage capable of shortening the time required for the manufacturing processes compared with a conventional method, and suppressing the leakage from or the contamination to the passage. Also, another purpose of the present invention is to provide a plate with a passage, a temperature adjustment plate, a cold plate, and a shower plate manufactured by such a manufacturing method.

Solution to Problem

To solve the problem described above and achieve the object, a method of manufacturing a plate with a passage according to the present invention includes: a step of forming a groove serving as the passage in a body plate formed of a metal or an alloy; a step of arranging a cover plate covering the groove on an upper part of the groove; and a step of forming a deposition layer covering the cover plate by accelerating metal or alloy powder with a gas and spraying the powder on the body plate and the cover plate in a solid phase.

In the method of manufacturing a plate with a passage described above, the step of forming a deposition layer is performed by a cold spray method.

In the method of manufacturing a plate with a passage described above, a surface of the cover plate covering the groove has an approximately equal shape to an opening of the groove and has a larger area than the opening.

The method of manufacturing a plate with a passage described above further includes a step of forming a hole connected to the passage in the body plate, or in the cover plate and in the deposition layer.

A plate with a passage according to the present invention, wherein the passage causing a fluid to circulate being formed inside the plate, includes: a body plate formed of a metal or an alloy, and in which a groove serving as the passage is provided; a cover plate covering the groove; and a deposition layer formed by accelerating metal or alloy powder with a gas and spraying the powder on the body plate and the cover plate in a solid phase, and covering the cover plate.

In the plate with the passage described above, the deposition layer is formed by a cold spray method.

In the plate with the passage described above, each of the body plate, the cover plate, and the deposition layer is formed of any one of aluminum (Al), an aluminum alloy, titanium (Ti), a titanium alloy, stainless steel, copper (Cu), and a copper alloy.

In the plate with the passage described above, at least any one of the body plate, the cover plate, and the deposition layer is formed of a different metal or an different alloy from at least any one of or any two of the other body plate, cover plate, and deposition layer.

In the plate with the passage described above, the groove is formed in a first main surface of the body plate and in a second main surface that is an opposite side of the first main surface.

The plate with the passage described above, a second groove serving as a second passage is formed in the deposition layer, and the plate further includes: a second cover plate covering the second groove; and a second deposition layer formed by accelerating metal or alloy powder with a gas and spraying the powder and the gas on the deposition layer and the second cover plate in a solid phase, and covering the second cover plate.

A temperature adjustment plate according to the present invention includes the plate with the passage, and the plate with the passage includes a heating medium introduction passage connected to the passage, and configured to introduce a heating medium to the passage; and a heating medium leading-out passage connected to the passage, and configured to lead the heating medium out of the passage.

A cold plate according to the present invention includes the plate with the passage, and the plate with the passage includes: a heating medium introduction passage connected to the passage, and configured to introduce a coolant to the passage; and a heating medium leading-out passage connected to the passage, and configured to lead the coolant out of the passage.

A shower plate according to the present invention includes the plate with the passage, and the plate with the passage includes: a gas introduction passage connected to the passage, and configured to introduce a gas having a predetermined component to the passage, and a gas leading-out hole connected to the passage, and configured to lead the gas out of the passage.

Advantageous Effects of Invention

According to the present invention, a passage inside a plate is formed such that a groove formed in a body plate is covered by a cover plate and a deposition layer formed by a cold spray method. Therefore, a time required for manufacturing processes can be shortened compared with a conventional manufacturing method in which bulk materials are joined or attached to each other. Also, the passage can be formed without using high-temperature heat or a material (a filler metal and the like) other than the base material. Therefore, it becomes possible to prevent the leakage from or the contamination to the passage.

DESCRIPTION OF EMBODIMENTS

Hereinafter, a method of manufacturing a plate with a passage, a plate with a passage, a temperature adjustment plate, a cold plate, and a shower plate according to embodiments of the present invention will be described in detail with reference to the drawings. Note that the present invention is not limited by these embodiments. Also, in the description of the drawings, equivalent parts will be provided with the same reference signs. Note that the drawings are schematic diagrams, and therefore, the relation between the thickness and the width of each part, a ratio of each part, and the like differ from reality. Between the drawings, some parts may include difference in the relation between mutual sizes or the ratios. Further, note that the terms referring to the direction such as "upper" and "lower" in the description below correspond to the description of the drawings.

First Embodiment

Figure 1A:
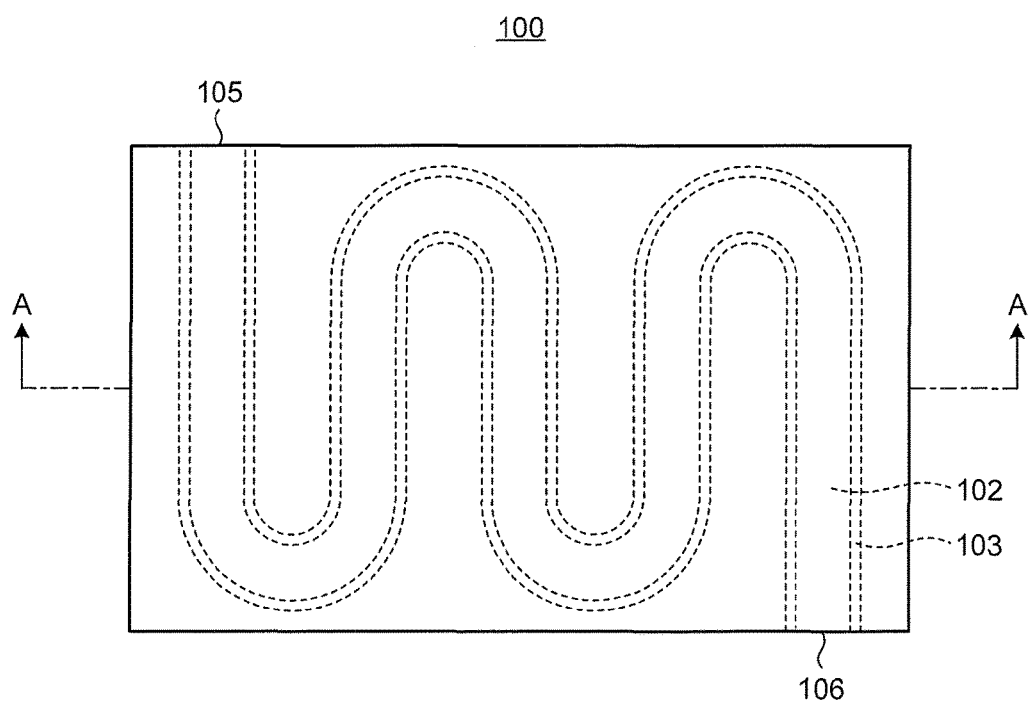
FIG. 1A is a top view illustrating a structure of a plate with a passage according to a first embodiment of the present invention.
Figure 1B:
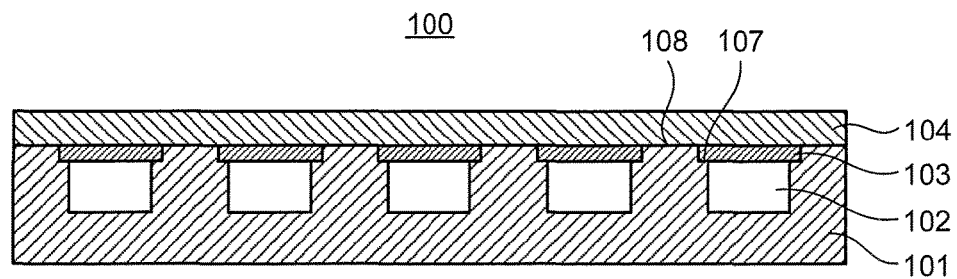
FIG. 1B is an A-A cross-sectional view of FIG. 1A.

FIG. 1A is a top view illustrating a structure of a plate with a passage according to a first embodiment of the present invention. Also, FIG. 1B is an A-A cross-sectional view of FIG. 1A.

A plate 100 with a passage includes a body plate 101 provided with a passage 102 that causes a fluid (a gas or a liquid) to circulate therein, a cover plate 103 that covers the passage 102, and a deposition layer 104 that covers the cover plate 103. The body plate 101 is provided with a support part 107 that supports the cover plate 103 over the passage 102. Also, end parts of the passage 102 are a fluid introduction port 105 that introduces a fluid into the passage 102 and a fluid leading-out port 106 that leads the fluid out of the passage 102.

The plate 100 with the passage in this manner is, for example, used as a temperature adjustment plate by causing a heating medium for cooling or for heating to circulate in the passage 102. Note that, in this case, either a main surface at a side of the body plate 101 or a main surface at a side of the deposition layer 104 may be used as a placing surface for an object to be temperature-adjusted (for example, a substrate and the like).

The body plate 101 and the cover plate 103 are formed of a bulk metal or an alloy. To be concrete, a metal or an alloy such aluminum (Al), an aluminum alloy, titanium (Ti), a titanium alloy, stainless steel, copper (Cu), and a copper alloy is used. The materials for the body plate 101 and the cover plate 103 are selected according to the type or the purpose of a fluid to circulate in the passage 102. To be concrete, in a case where the plate with the passage is applied to a temperature adjustment plate and causes water or seawater to circulate as the heating medium, titanium, a titanium alloy, stainless steel, and the like may be used in order to avoid corrosion of the body plate 101. Also, in a case of causing a non-corrosive fluid such as an organic solvent to circulate, aluminum or an aluminum alloy having excellent thermal conductivity may be used. Further, the body plate 101 and the cover plate 103 may be formed of a metal or an alloy of the same type, or may be formed of metals or alloys of different types. For example, a combination may be used in which the body plate 101 is formed of aluminum or an aluminum alloy having excellent thermal conductivity, and the cover plate 103 is formed of titanium or a titanium alloy having higher strength than aluminum or an aluminum alloy.

The deposition layer 104 is formed on a cover plate placing surface 108 of the cover plate 103 and the body plate 101 by a cold spray method in which metal or alloy powder is accelerated with a gas, and is sprayed in a solid phase on an object to be subjected to deposition. As the material for the deposition layer 104, similar to the above-described body plate 101 and the cover plate 103, a metal or an alloy such as aluminum (Al), an aluminum alloy, titanium (Ti), a titanium alloy, stainless steel, copper (Cu), and a copper alloy is used. Also, as the material for the deposition layer 104, a metal or an alloy that is the same type as the body plate 101 or the cover plate 103 may be used, or a metal or an alloy of a different type may be used. For example, to prevent corrosion caused by the heating medium circulating in the passage 102, the body plate 101 and the cover plate 103 are formed of stainless steel. To improve the thermal conductivity at a side of the deposition layer 104, it is possible to select the material such that the deposition layer 104 is formed of an aluminum alloy.

Figure 2:
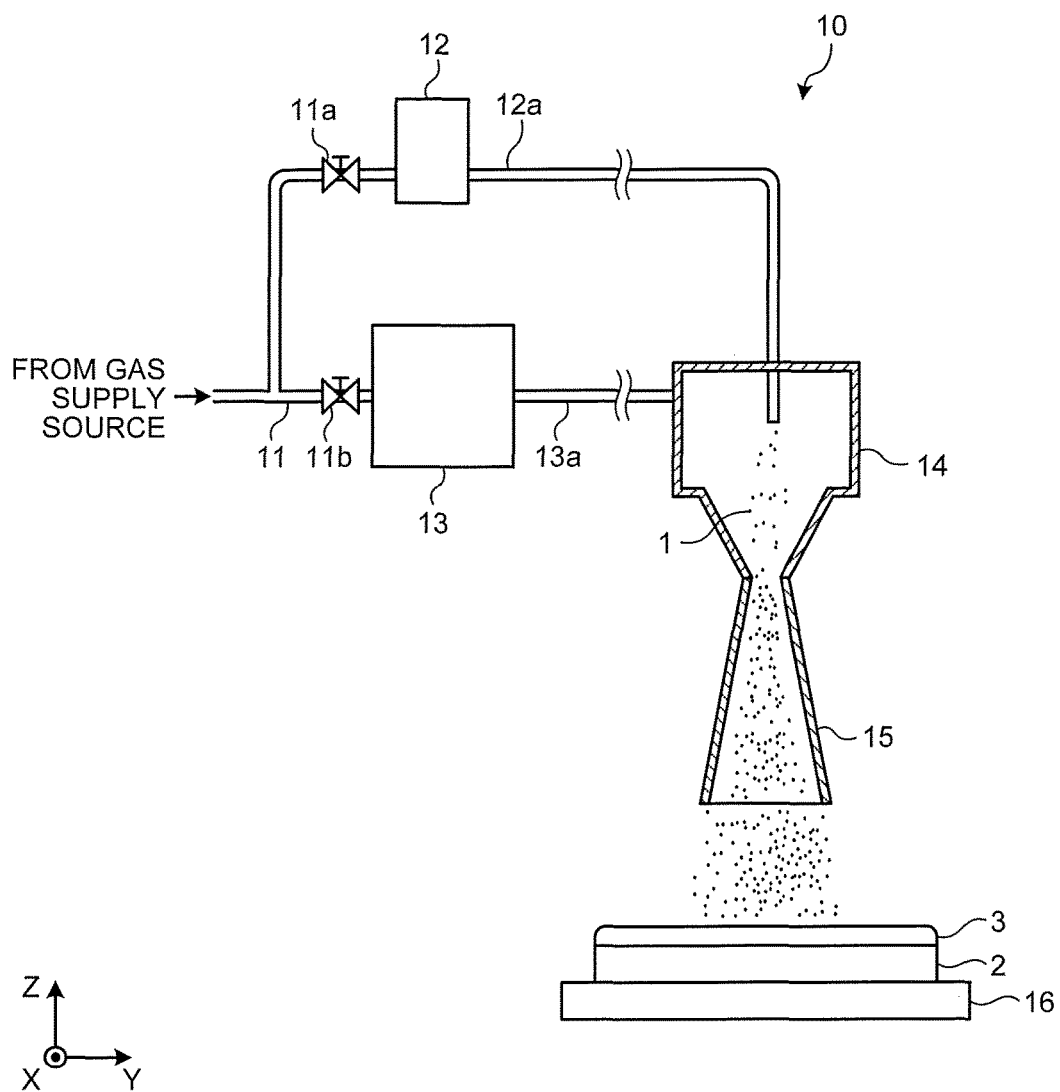
FIG. 2 is a schematic diagram illustrating configuration of a deposition apparatus according to a cold spray method.

FIG. 2 is a schematic diagram illustrating a configuration of a deposition apparatus according to a cold spray method. A deposition apparatus 10 includes a gas introduction pipe 11 that introduces an inert gas such as helium (He) and nitrogen ($N_2$) or a gas such as air (working medium) from a gas supply source, a powder supply unit 12 that supplies powder 1 of an aluminum-based metal as a material, a heater 13 that heats the gas introduced from the gas introduction pipe 11 to a desired temperature, a chamber 14 that mixes and sprays the powder 1 and the gas, a nozzle 15 that sprays the powder 1, and a holder 16 that holds a substrate 2 and the like that is an object to be subjected to deposition.

The powder 1 of a minute metal or alloy (for example, the particle diameter is about 10 to 100 μm) is arranged in the powder supply unit 12. The powder 1 is supplied to the chamber 14 through a powder supply pipe 12a along with a gas by operating a valve 11a provided in the gas introduction pipe 11 to introduce the gas into the powder supply unit 12 at a desired flow rate.

The heater 13 heats the introduced gas to, for example, about 50 to 700° C. An upper limit of the heating temperature is less than a melting point of the material because the powder 1 is sprayed on the substrate 2 in a solid phase. More favorably, the upper limit temperature is kept about 60% or less of the melting point centigrade. This is because the higher the heating temperature, the more likely the powder 1 gets oxidized. Therefore, for example, in a case of forming a deposition of aluminum (the melting point: about 660° C.), the heating temperature may just be less than about 660° C., and more favorably, may be about 396° C. or less.

The gas heated in the heater 13 is introduced into the chamber 14 via a gas piping 13a. Note that the flow rate of the gas introduced into the chamber 14 is adjusted by operating a valve 11b provided in the gas introduction pipe 11.

A flow of the gas from the nozzle 15 to the substrate 2 is formed inside the chamber 14 by the gas introduced from the gas piping 13a. When the powder 1 is supplied to the chamber 14 from the powder supply unit 12, the powder 1 is accelerated by the flow of the gas and heated, and sprayed on the substrate 2 from the nozzle 15. The powder 1 eats into a surface of the substrate 2 by an impact of the spray, is subjected to plastic deformation by kinetic energy and thermal energy that the powder 1 has, and is deposited on the surface of the substrate 2, so that a deposition layer 3 of a metal or an alloy is formed.

Velocity that accelerates the powder 1, that is, the flow velocity of the gas at the time of being sprayed from the nozzle 15 is supersonic (about 340 m/s or more), and is favorably about 400 m/s or more, for example. This velocity can be controlled by adjusting the flow rate of the gas introduced into the chamber 14 by operating the valve 11b. Also, the flow of the gas formed in the chamber 14 can be narrowed once at an introduction passage of the nozzle 15 and be accelerated by using the nozzle 15 that has a bore diameter tapering from a base to a tip, like the deposition apparatus 10.

As illustrated in FIG. 2, when a deposition range (the area of the substrate 2) with respect to the bore diameter of the nozzle 15 is large, the deposition is performed while moving the nozzle 15 in the X-Y direction. Alternatively, the position of the nozzle 15 is fixed and the holder 16 side may be moved.

Next, a method of manufacturing the plate 100 with the passage will be described. FIG. 3 are diagrams illustrating a method of manufacturing the plate 100 with the passage. In this first embodiment, the plate 100 with the passage formed of stainless steel and aluminum is manufactured.

Figure 3A:
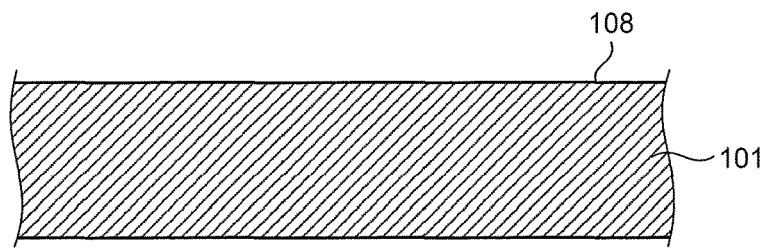
FIG. 3A is a diagram illustrating a process of forming a body plate in a method of manufacturing the plate with a passage illustrated in FIG. 1.

First, as illustrated in FIG. 3A, stainless steel is formed into a desired shape to manufacture the body plate 101.

Figure 3B:
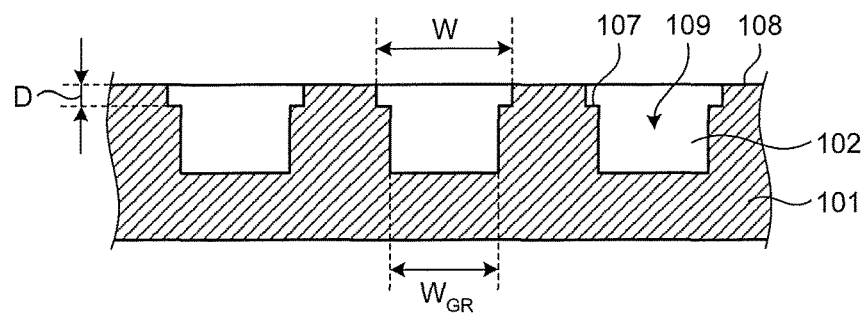
FIG. 3B is a diagram illustrating a process of forming a groove in the method of manufacturing the plate with a passage illustrated in FIG. 1.

Next, as illustrated in FIG. 3B, a groove 109 that serves as the body passage 102 is formed in one of main surfaces of the body plate 101 (in the cover plate placing surface 108) by means of machining and the like, and an edge of an opening of the groove 109 is cut off, so that the support part 107 is formed. The width W of the support part 107 may just be the width that is enough to support the cover plate 103, that is, may just be slightly larger than the width $W_{GR}$ of the groove 109. Also, the depth D of the support part 107 may just be equivalent to the cover plate 103. Note that the cross-section shape of the passage 102 is not limited to a rectangle, and may be formed into any shape (for example, a rectangle with round corners, a trapezoid, a semicircle, a semi-ellipse, and the like).

Figure 3C:
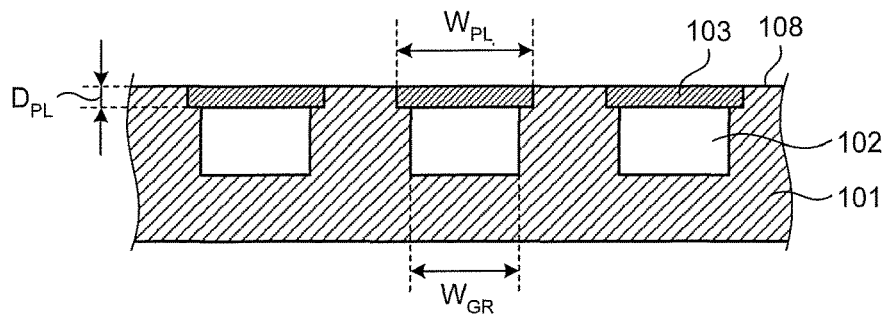
FIG. 3C is a diagram illustrating a process of arranging a cover plate in the method of manufacturing the plate with a passage illustrated in FIG. 1.

Next, as illustrated in FIG. 3C, the cover plate 103 formed of stainless steel and formed into a predetermined shape is arranged on the support part 107. A surface of the cover plate 103, which covers the groove 109, has an approximately equal shape to the opening of the groove 109 (for example, a similar figure), and is formed such that the area is larger than the opening of the groove 109. That is, the width $W_{PL}$ of the cover plate may just satisfy $W_{GR}<W_{PL}\leq W$. Also, the thickness $D_{PL}$ of the cover plate 103 is, in consideration of the next process in which the powder is sprayed thereon, favorably a thickness in accordance with the hardness of the material and the cross-section shape.

Figure 3D:
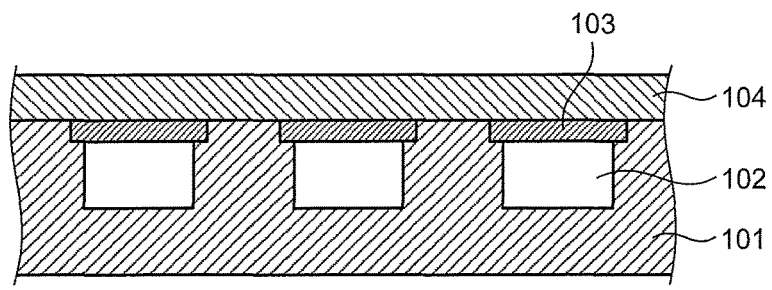
FIG. 3D is a diagram illustrating a process of forming a deposition layer in the method of manufacturing the plate with a passage illustrated in FIG. 1.

Following that, the body plate 101 and the cover plate 103 are set in the holder 16 of the deposition apparatus 10, aluminum powder is poured into the powder supply unit 12, and the deposition is performed so as to cover the cover plate 103. Accordingly, the deposition layer 104 illustrated in FIG. 3D is formed. As a result, the plate 100 with the passage is completed. Note that, following that, a surface may be smoothed by applying polishing, machining, and the like to an upper surface and a side face of the deposition layer 104. Further, the thickness of the deposition layer 104 may be adjusted and a deposited film and the like that adhere on an unnecessary portion may also be removed.

According to the first embodiment described above, the deposition layer 104 that covers the cover plate 103 to seal the passage 102 in is formed by the cold spray method, whereby a manufacturing time can be shortened compared with a conventional method that joins a bulk material by means of welding or brazing. Also, unlike welding, because a base material (the body plate, the cover plate, and the deposition layer) is not subjected to high-temperature heating, the leakage from the passage caused by heat distortion of the base material can be suppressed. Further, because a third member (a filler metal, an adhesive, and the like) other than the base material is not used, the contamination to the passage caused by flowing-in of such a member can be suppressed.

Also, in the first embodiment, because the deposition layer 104 is formed by a cold spray method, high air tightness between the body plate 101 or the cover plate 103 and the deposition layer 104, and between the body plate 101 and the cover plate 103 can be maintained. This may also be applied to a case where the body plate 101, the cover plate 103, and the deposition layer 104 are formed of metals of different types as well as formed of a metal of the same type. This is because, in the cold spray method, the metal powder 1 collides with and eats in a surface of a lower layer (the body plate 101, an upper surface of the cover plate 103, the deposition layer 104 deposited by then) at high speed, and strongly adheres to the lower layer by deforming itself. This can also be seen from the fact that the phenomenon (called "anchor effect") is observed in which the deposition layer 104 eats in the other side at an interface between the body plate 101 or the cover plate 103 and the deposition layer 104. Also, even if a backlash is caused between the body plate 101 and the cover plate 103, the powder 1 fills up a gap by the cold spray method. Therefore, the air tightness is still secured.

The deposition layer 104 is adhered to a lower layer of the plate 100 with the passage as described above. Therefore, there is little chance that the heat transfer performance at an interface between the deposition layer 104 and the body plate 101 or the cover plate 103 is lowered. Also, because the deposition layer 104 itself is a very compact layer, (for example, the density is 95% or more, compared with the bulk material), satisfactory heat transfer performance of 90% or more of the bulk material is maintained in the deposition layer 104. Therefore, when the plate 100 with the passage is used, for example, as a temperature adjustment plate, the temperature of an object (a substrate, and the like) placed on the plate 100 with the passage can be efficiently and uniformly adjusted. Further, because the leakage of a fluid from the passage 102 can be prevented, the reliability of the temperature control of the fluid (that is, the temperature control of the placing surface) can be maintained.

Note that, in the first embodiment, the fluid introduction port 105 and the fluid leading-out port 106 are provided in the side faces of the body plate 101. However, these ports may be provided in a lower surface of the body plate 101 or an upper surface of the deposition layer 104. In this case, when the groove 109 that serves as the passage 102 is formed, the groove 109 is formed in an inner side than the side face of the body plate 101, so that the groove 109 is prevented from opening in the side face of the body plate 101. Then, a hole communicated with the passage 102 from a lower surface side of the body plate 101 or from an upper surface side of the deposition layer 104 may just be formed.

Next, first to fourth modified examples of the plate 100 with the passage according to the first embodiment will be described.

Figure 4:
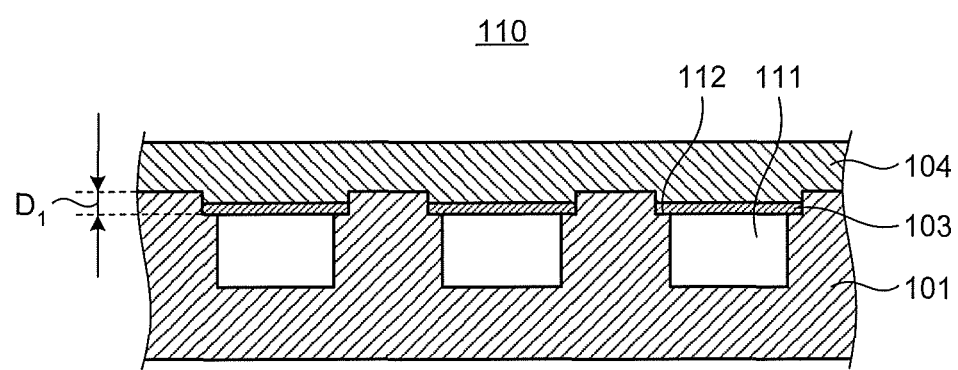
FIG. 4 is a cross-sectional view illustrating a first modified example of the plate with a passage.

FIG. 4 is a cross-sectional view illustrating the first modified example. In a plate 110 with a passage illustrated in FIG. 4, the depth $D_1$ of a support part 112 that supports the cover plate 103 is larger than the thickness of the cover plate 103. In this case, a passage 111 can be provided deeper in the body plate 101.

Figure 5:
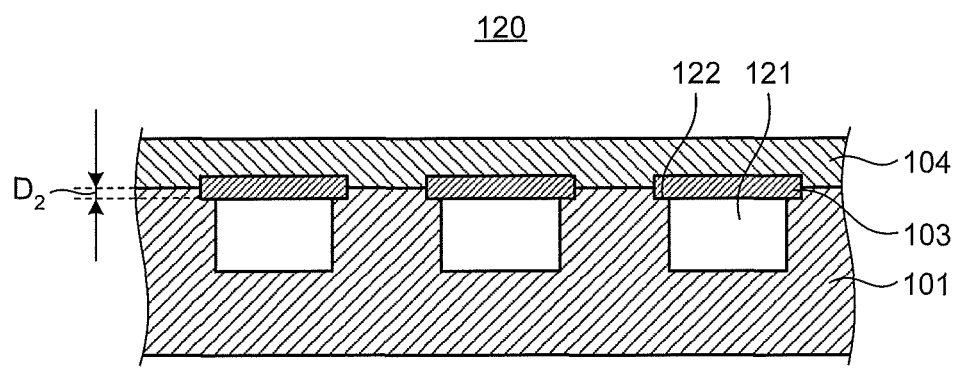
FIG. 5 is a cross-sectional view illustrating a second modified example of the plate with a passage.

FIG. 5 is a cross-sectional view illustrating the second modified example. In a plate with a passage 120 illustrated in FIG. 5, the depth $D_2$ of a support part 122 that supports a cover plate 103 is smaller than the thickness of the cover plate 103. In this case, a position aberration of the cover plate 103 in a forming process of the deposition layer 104 can be prevented while a machining process time for forming a passage 121 and the support part 122 can be shortened.

Figure 6:
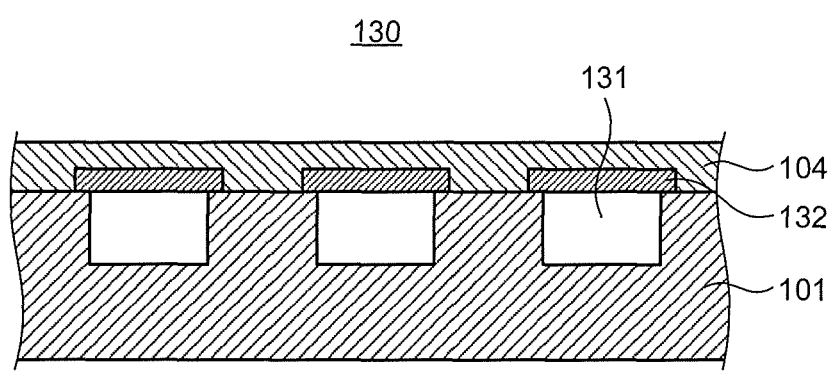
FIG. 6 is a cross-sectional view illustrating a third modified example of the plate with a passage.

FIG. 6 is a cross-sectional view illustrating a third modified example. In a plate 130 with a passage illustrated in FIG. 6, a cover plate 132 that covers each passage 131 is placed on an upper surface of the body plate 101. In this case, a machining process of forming a support part that supports the cover plate 132 can be reduced. Also, it is not necessary to keep the cover plate 132 inside the support part. Therefore, constraint on the shape of the cover plate 132 can be relieved.

Figure 7:
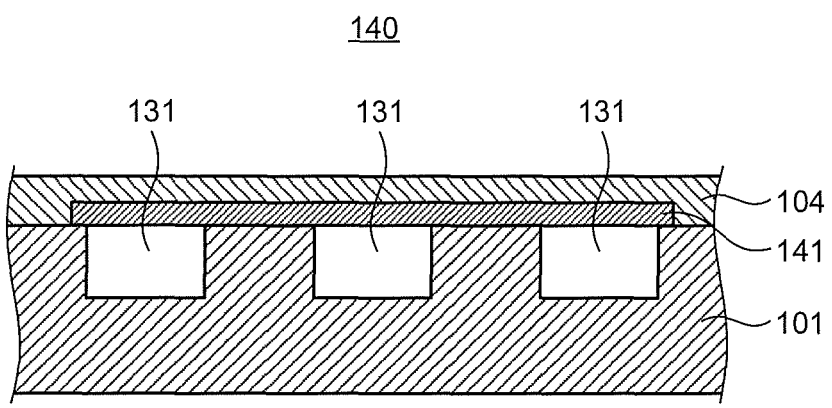
FIG. 7 is a cross-sectional view illustrating a fourth modified example of the plate with a passage.

FIG. 7 is a cross-sectional view illustrating a fourth modified example. In a plate 140 with a passage illustrated in FIG. 7, a cover plate 141 continuously formed between adjacent passages 131 is arranged on an upper surface of the body plate 101. In this case, the cover plate 141 is formed in a shape capable of covering at least the passages 131. Therefore, a forming process of the cover plate 141 can be simplified.

Second Embodiment

Figure 8A:
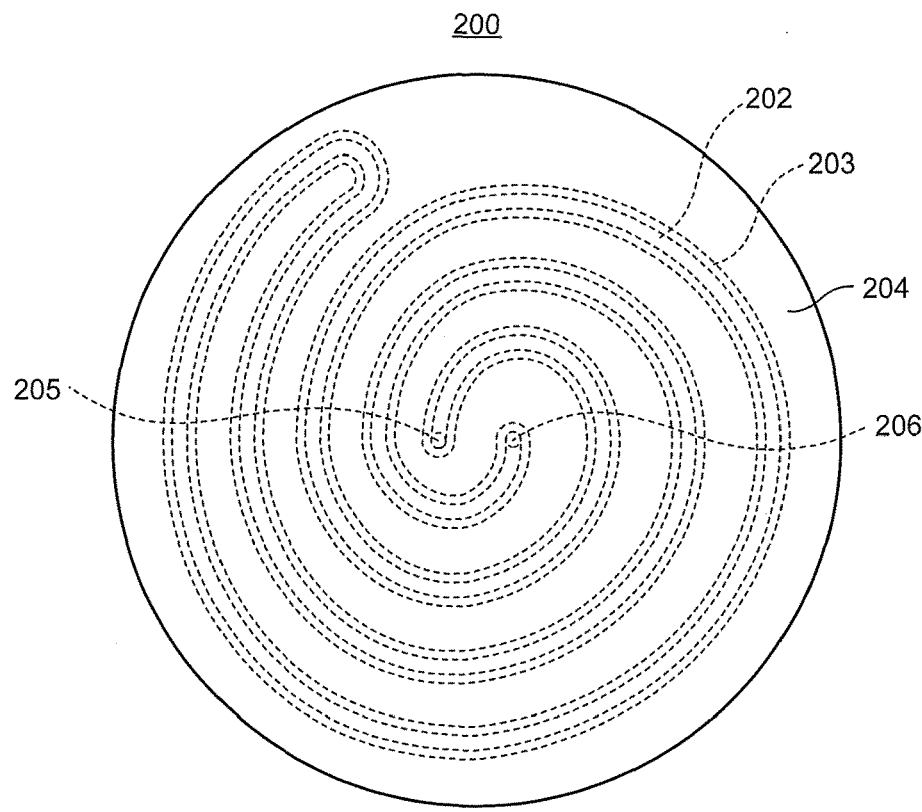
FIG. 8A is a top view illustrating a structure of a temperature adjustment plate as an application example of a plate with a passage according to a second embodiment of the present invention.
Figure 8B:
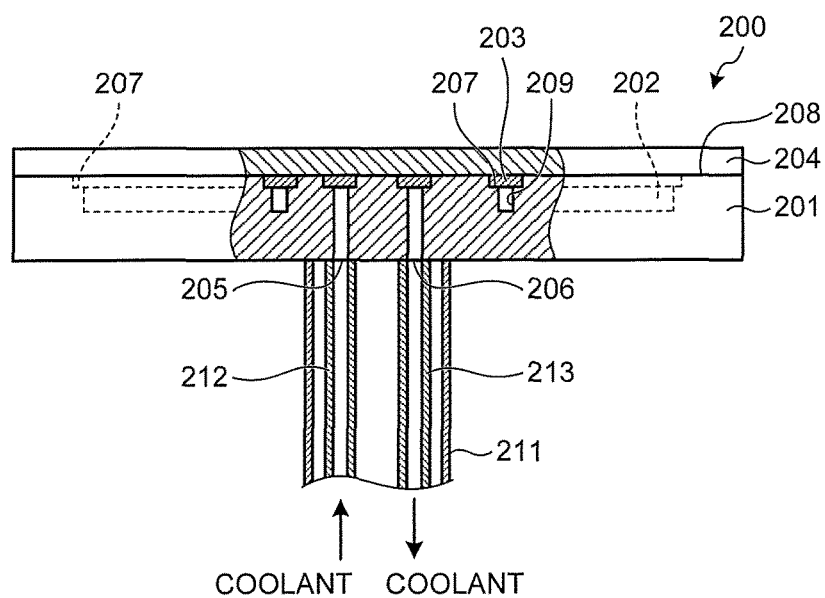
FIG. 8B is a partially cross-sectional side view of the temperature adjustment plate illustrated in FIG. 8A.

Next, a plate with a passage according to a second embodiment of the present invention will be described. In the present the second embodiment, in a deposition apparatus and the like according to a chemical vapor deposition (CVD) method, the plate with a passage is used as a cold plate that is provided in a deposition chamber and cools a substrate. FIG. 8A is a top view illustrating a cold plate as a plate with a passage according to the second embodiment. Also, FIG. 8B is a partially cross-sectional side view illustrating the cold plate illustrated in FIG. 8A.

A cold plate 200 includes a body plate 201 provided with a passage 202 and a support part 207, a cover plate 203 that is held by the support part 207 and covers the passage 202, and a deposition layer 204 that covers the cover plate 203. The body plate 201 and the cover plate 203 are, similar to the first embodiment, for example, formed of an aluminum bulk material. Meanwhile, the deposition layer 204 is formed by a cold spray method using aluminum powder, for example. An upper surface of the deposition layer 204 serves as a placing surface on which a substrate as an object to be cooled is placed.

The passage 202 is formed like a swirl spreading from the center toward an outer periphery and returning back to the center again, and both ends of the passage 202 are positioned in the vicinity of the center. In the vicinity of the center of the body plate 201, a heating medium introduction passage 205 that introduces a coolant into the passage 202 and a heating medium leading-out passage 206 that leads the coolant out of the passage 202 are provided.

Such a cold plate 200 is supported by a shaft 211 and used. A coolant supply pipe 212 connected to the heating medium introduction passage 205 and a coolant exhaust pipe 213 connected to the heating medium leading-out passage 206 are housed in the shaft 211.

A method of manufacturing the cold plate 200 is as follows. That is, similar to the explanation in the first embodiment with reference to FIG. 3, first, a groove 209 that serves as the passage 202 is formed in one of main surfaces of the body plate 201 (a cover plate placing surface 208) and the support part 207 is formed by cutting off an edge of an opening of the groove 209. Then, the cover plate 203 that has an approximately equal shape to the opening of the groove 209 (for example, a similar figure) and has a larger area than the opening is arranged on the support part 207. Next, the deposition layer 204 that covers the cover plate 203 is formed by the deposition apparatus 10 illustrated in FIG. 2. Further, the heating medium introduction passage 205 and the heating medium leading-out passage 206 are formed from a lower surface side of the body plate 201.

According to the second embodiment, a temperature adjustment apparatus that has a complicated passage pattern as illustrated in FIG. 8A and has satisfactory heat transfer performance and air tightness of the passage can be easily manufactured.

Note that, in this second embodiment, because the surface of the deposition layer 204 side is used as a placing surface of a substrate, the heating medium introduction passage 205 and the heating medium leading-out passage 206 are provided at the body plate 201 side. However, conversely, the surface of the body plate 201 side is used as the placing surface of the substrate and the heating medium introduction passage 205 and the heating medium leading-out passage 206 may be provided at the deposition layer 204 side.

Third Embodiment

Figure 9A:
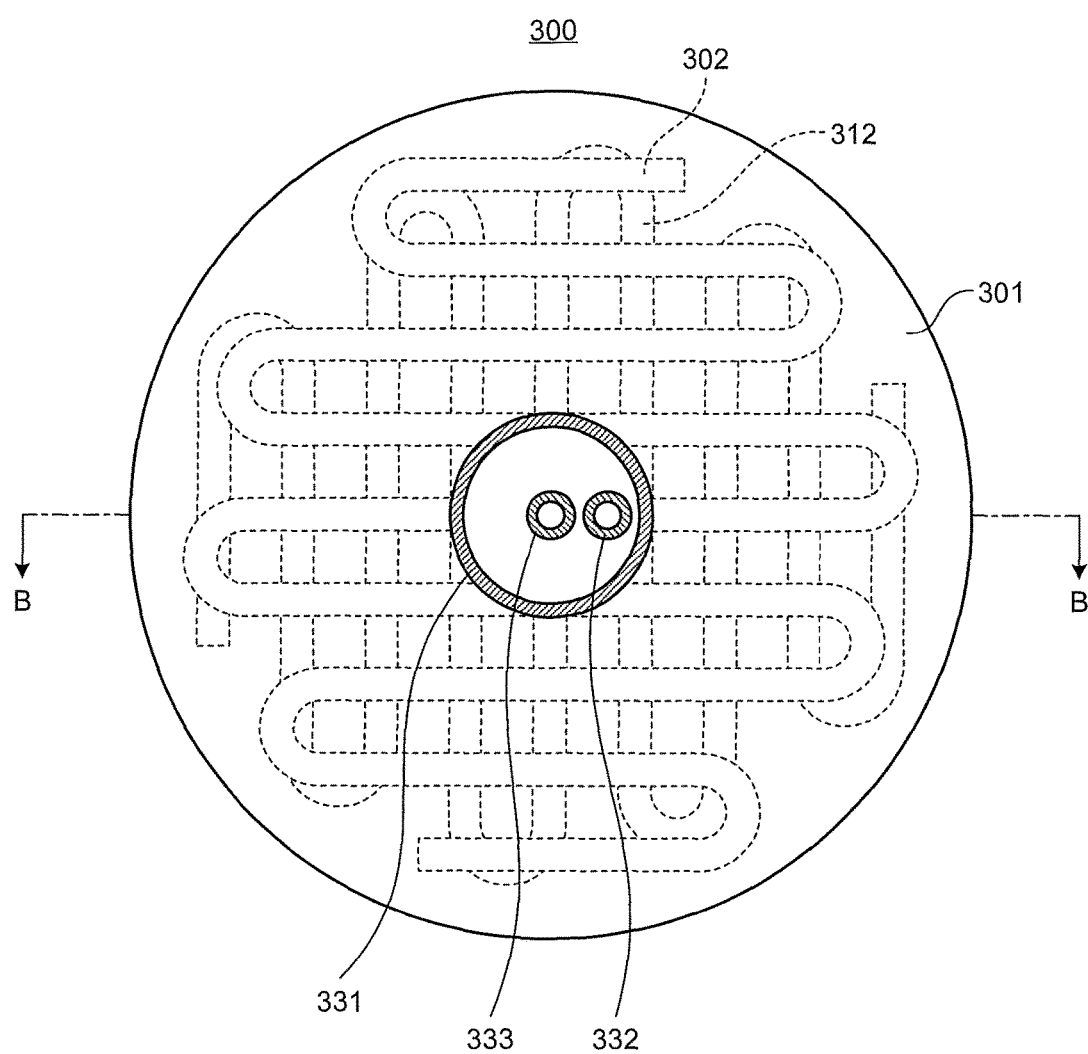
FIG. 9A is a top view illustrating a structure of a shower plate as an application example of a plate with a passage according to a third embodiment of the present invention.

Next, a plate with a passage according to a third embodiment of the present invention will be described. In this third embodiment, in a deposition apparatus and the like according to a CVD method, a plate with a passage is applied to a shower plate that is provided in a deposition chamber and supplies two types of deposition gases to a substrate. FIG. 9A is a top view illustrating the shower plate as the plate with a passage according to the third embodiment. Also, FIG. 9B is a B-B cross-sectional view of FIG. 9A.

Figure 9B:
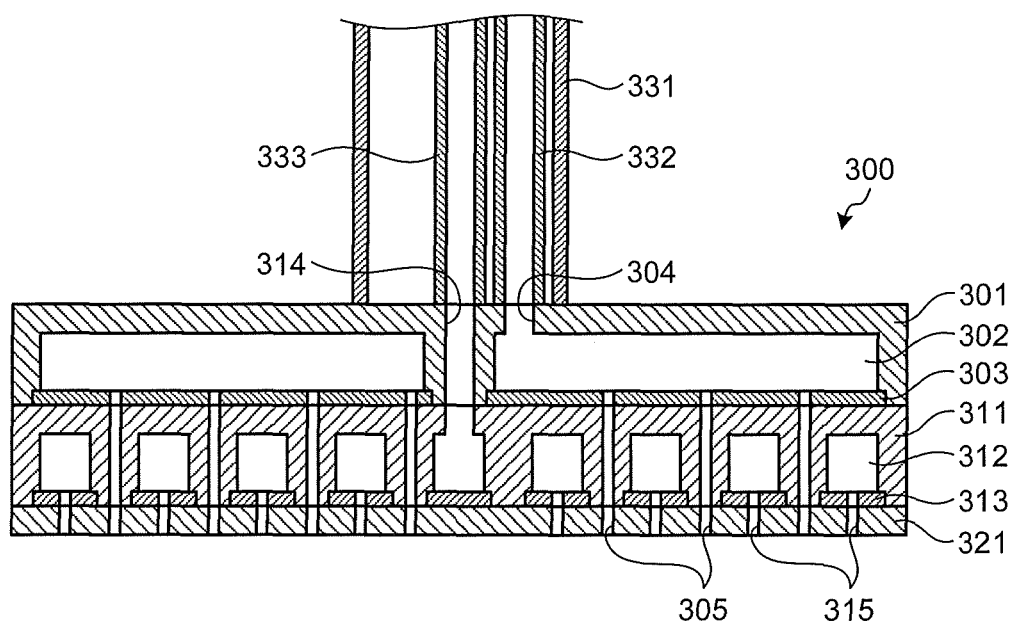
FIG. 9B is a B-B cross-sectional view of FIG. 9A.

As illustrated in FIGS. 9A and 9B, a shower plate 300 includes a body plate 301 in which a first passage 302 that causes a first deposition gas to circulate therein is formed, a cover plate 303 that covers the first passage 302, a deposition layer 311 that covers the cover plate 303 and in which a second passage 312 that causes a second deposition gas to circulate therein is formed, a cover plate 313 that covers the second passage 312, and a deposition layer 321 that covers the cover plate 313. The shower plate 300 in this manner is used while being supported by a shaft 331. A first gas supply pipe 332 that supplies the first deposition gas and a second gas supply pipe 333 that supplies the second deposition gas are housed in the shaft 331.

The shower plate 300 includes a first gas introduction passage 304 that is connected to the first gas supply pipe 332 and introduces the first deposition gas into the first passage 302, and a second gas introduction passage 314 that is connected to the second gas supply pipe 333 and introduces the second deposition gas into the second passage 312. Also, the shower plate 300 includes a plurality of first gas leading-out holes 305 that leads out the first deposition gas circulating in the first passage 302 and a plurality of second gas leading-out holes 315 that leads out the second deposition gas circulating in the second passage 312.

Also, the first passage 302 and the second passage 312 are arranged to be mutually shifted so that the first gas leading-out holes 305 may not touch the second passage 312 and the second gas introduction passage 314 may not touch the first passage 302.

When the shower plate 300 is used, the first deposition gas supplied from the first gas supply pipe 332 is discharged from the first gas leading-out holes 305 through the first passage 302, and the second deposition gas supplied from the second gas supply pipe 333 is discharged from the second gas leading-out holes 315 through the second passage 312. These first and second deposition gases are mixed after discharged from the shower plate 300 and contribute to the deposition.

Next, a method of manufacturing the shower plate 300 will be described. FIGS. 10A to 10I are diagrams illustrating the method of manufacturing the shower plate 300. In the third embodiment, an aluminum alloy is used as the material for the shower plate 300.

Figure 10A:
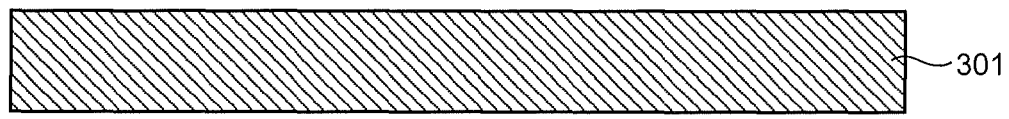
FIG. 10A is a diagram illustrating a process of forming a body plate in a method of manufacturing the shower plate illustrated in FIG. 9B.

First, as illustrated in FIG. 10A, a bulk aluminum alloy is formed into a desired shape to produce the body plate 301.

Figure 10B:
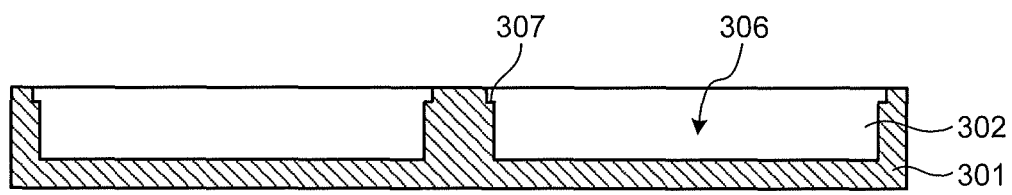
FIG. 10B is a diagram illustrating a process of forming a first passage in the method of manufacturing the shower plate illustrated in FIG. 9B.
Figure 10C:
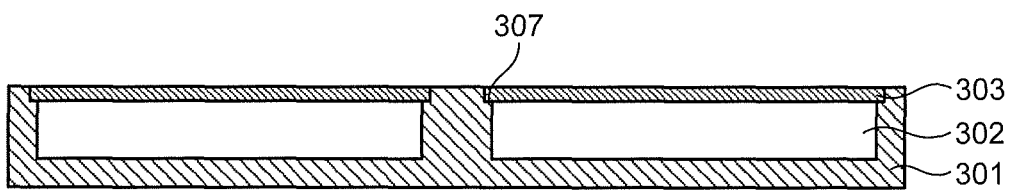
FIG. 10C is a diagram illustrating the process of forming a first passage in the method of manufacturing the shower plate illustrated in FIG. 9B.

Next, as illustrated in FIG. 10B, a groove 306 that serves as the first passage 302 is formed in one of main surfaces of the body plate 301 by means of machining and the like, and a support part 307 is formed by cutting off an edge of an opening of the groove 306. Then, as illustrated in FIG. 10C, the cover plate 303 made of an aluminum alloy, which has an approximately equal shape to the opening of the groove 306 (for example, a similar figure) and has a larger area than the opening, is arranged on the support part 307.

Figure 10D:
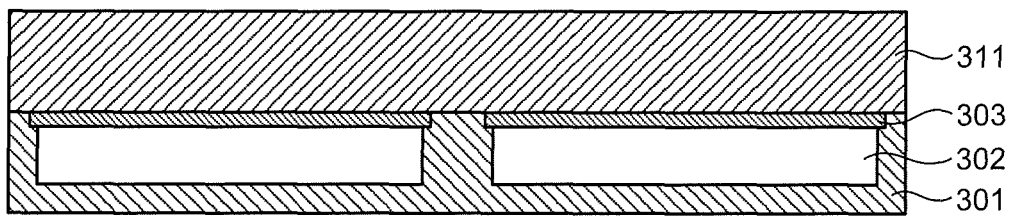
FIG. 10D is a diagram illustrating the process of forming a first passage in the method of manufacturing the shower plate illustrated in FIG. 9B.

The body plate 301 and the cover plate 303 are set in the holder 16 of the deposition apparatus 10 illustrated in FIG. 2 and aluminum alloy powder is poured into the powder supply unit 12, and the deposition is performed so as to cover the body plate 301 and the cover plate 303 by a cold spray method. Accordingly, the deposition layer 311 illustrated in FIG. 10D is formed. The deposition layer 311 has the thickness that is enough to form the second passage 312 in a following process, and favorably, may be equivalent to the body plate 301. Also, after the deposition, a surface of the deposition layer 311 is smoothed by means of polishing and the like, and a deposited film adhering on an unnecessary portion is removed.

Figure 10E:
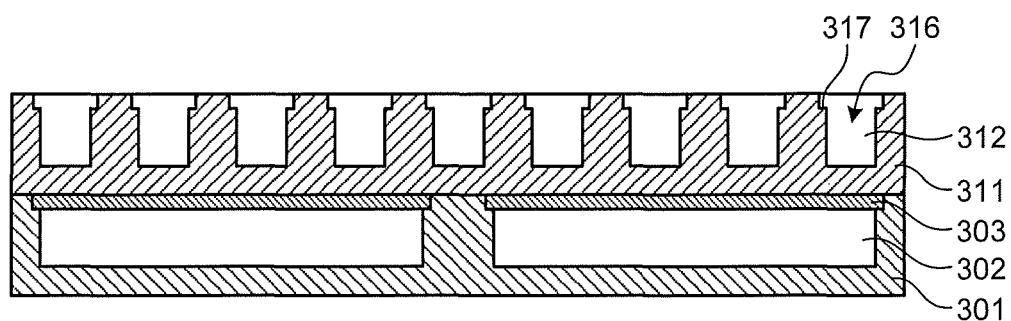
FIG. 10E is a diagram illustrating a process of forming a second passage in the method of manufacturing the shower plate illustrated in FIG. 9B.
Figure 10F:
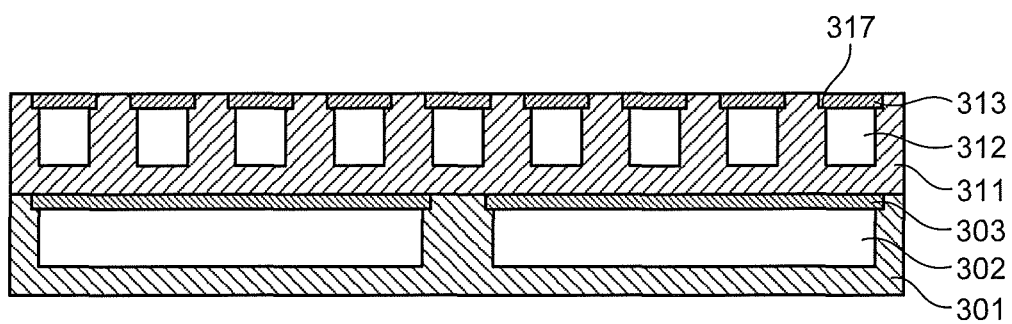
FIG. 10F is a diagram illustrating the process of forming a second passage in the method of manufacturing the shower plate illustrated in FIG. 9B.
Figure 10G:
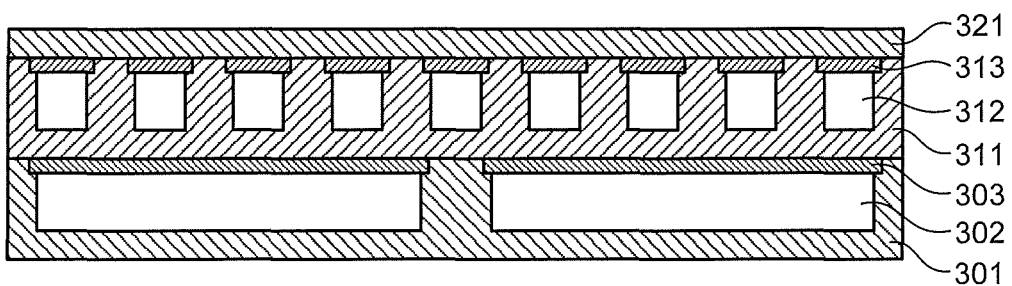
FIG. 10G is a diagram illustrating the process of forming a second passage in the method of manufacturing the shower plate illustrated in FIG. 9B.

Next, as illustrated in FIG. 10E, a groove 316 that serves as the second passage 312 is formed in the deposition layer 311 by means of machining and the like, and a support part 317 is formed by cutting off an edge of an opening of the groove 316. Then, as illustrated in FIG. 10F, the cover plate 313 made of an aluminum alloy, which has an approximately equal shape to the opening of the groove 316 (for example, a similar figure) and has a larger area than the opening, is arranged on the support part 317. This plate is set in the deposition apparatus 10, and the deposition is performed so as to cover the deposition layer 311 and the cover plate 313 by a cold spray method using the aluminum alloy powder. Accordingly, the deposition layer 321 illustrated in FIG. 10G is formed. Further, a surface of the deposition layer 321 is smoothed by means of polishing and the like, and a deposited film adhering on an unnecessary portion is removed.

Figure 10H:
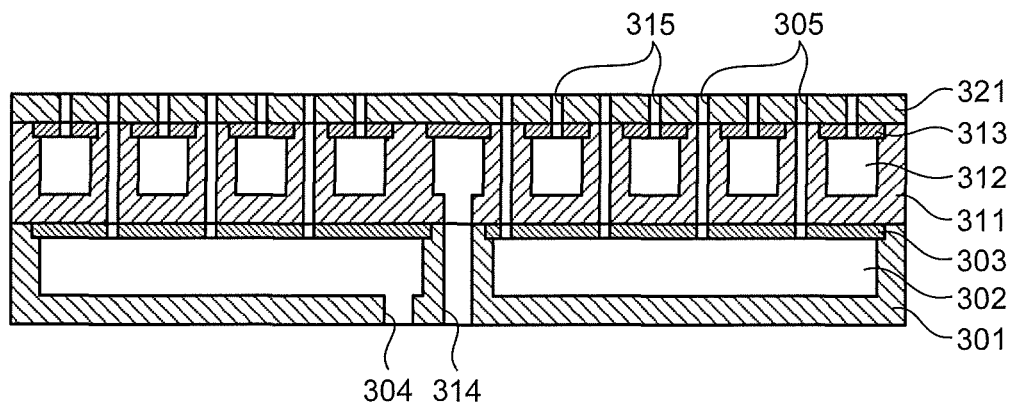
FIG. 10H is a diagram illustrating the process of forming a gas introduction passage and the like in the method of manufacturing the shower plate illustrated in FIG. 9B.
Figure 10I:
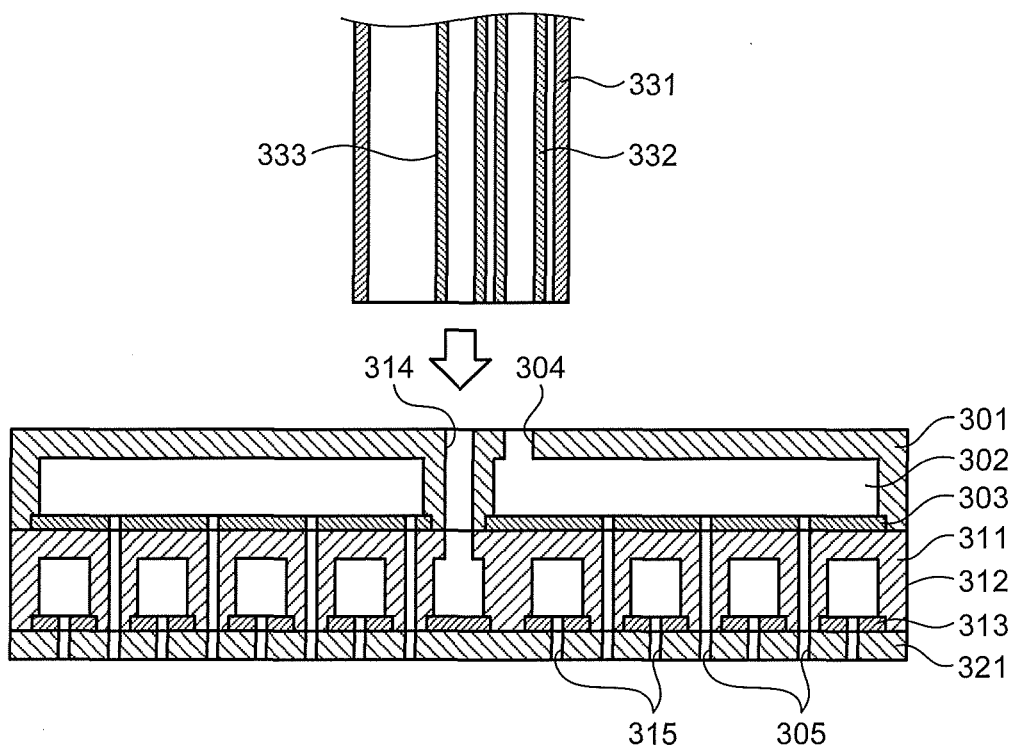
FIG. 10I is a diagram illustrating a process of joining a shaft and the like in the method of manufacturing the shower plate illustrated in FIG. 9B.

Next, as illustrated in FIG. 10H, the first gas introduction passage 304 that penetrates the body plate 301 and is connected to the first passage 302 is provided from a surface side of the body plate 301. Similarly, the second gas introduction passage 314 that penetrates the body plate 301 and the deposition layer 311 and is connected to the second passage 312 is formed. Also, the plurality of first gas leading-out holes 305 that penetrates the deposition layer 321, the deposition layer 311, and the cover plate 303 from a surface side of the deposition layer 321 and is connected to the first passage 302 is formed. Similarly, the plurality of second gas leading-out holes 315 that penetrates the deposition layer 321 and the cover plate 313 and is connected to the second passage 312 is formed. Then, as illustrated in FIG. 10I, the first gas supply pipe 332 is connected to the first gas introduction passage 304 and the second gas supply pipe 333 is connected to the second gas introduction passage 314. Further, the shaft 331 is joined to the body plate 301 by means of electron beam welding and the like, whereby the shower plate 300 illustrated in FIGS. 9A and 9B is completed.

According to the third embodiment described above, vicinities of the cover plates 303 and 313 respectively arranged on the first and second passages 302 and 312 are respectively covered by the deposition layers 311 and 321 formed by the cold spray method, whereby the air tightness of the first and second passages 302 and 312 can be secured. Therefore, the mixture of the two types of deposition gases respectively supplied from two channels of the first gas supply pipe 332 and the second gas supply pipe 333 in the shower plate or the leakage of the gases from the shower plate can be prevented.

Note that, in the third embodiment, the first and second gas introduction passages 304 and 314 are provided at the body plate 301 side and the first and second gas leading-out holes 305 and 315 are provided at the deposition layer 321 side. However, conversely, the first and second gas introduction passages 304 and 314 may be provided at the deposition layer 321 side and the first and second gas leading-out holes 305 and 315 may be provided at the body plate 301 side.

Also, in the third embodiment, the depths of the support parts 307 and 317 are made equivalent to the thicknesses of the cover plates 303 and 313. However, similar to the first and the second modified examples (see FIGS. 4 and 5) of the first embodiment, the depths of the support parts 307 and 317 may be larger or smaller than the thicknesses of the cover plates 303 and 313. Alternatively, similar to the third modified example (see FIG. 6), without providing the support parts 307 and 317, the cover plates 303 and 313 formed slightly larger than the passages 302 and 312 are respectively placed on the body plate 301 and the deposition layer 311, so that the first and second passages 302 and 312 may be covered.

Further, although, in the third embodiment, a shower plate having two passages (the first and second passages) is produced, the number of passages may be three or more by repeating the processes illustrated in FIGS. 10E to 10G, or the number of passages may be one by omitting these processes.

Fourth Embodiment

Figure 11:
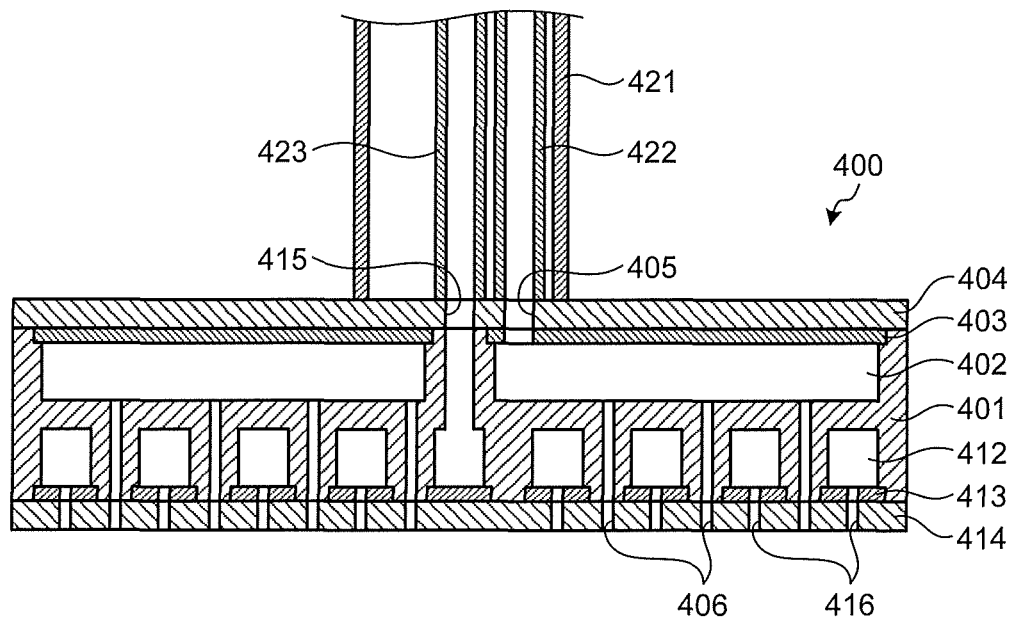
FIG. 11 is a cross-sectional view illustrating a structure of a shower plate as an application example of a plate with a passage according to a fourth embodiment of the present invention.

Next, a plate with a passage according to a fourth embodiment of the present invention will be described. In this fourth embodiment, the plate with a passage is applied to a shower plate that supplies two types of gases into a substrate in a deposition chamber, similar to the third embodiment. FIG. 11 is a cross-sectional view illustrating the shower plate as the plate with a passage according to the fourth embodiment. Note that the top view of the shower plate is similar to the one illustrated in FIG. 9A.

As illustrated in FIG. 11, a shower plate 400 includes a body plate 401 in which a first passage 402 that causes a first deposition gas to circulate therein and a second passage 412 that causes a second deposition gas to circulate therein are formed, a cover plate 403 that covers the first passage 402, a deposition layer 404 that covers the cover plate 403, a cover plate 413 that covers the second passage 412, and a deposition layer 414 that covers the cover plate 413. The shower plate 400 in this manner is used while being supported by a shaft 421. A first gas supply pipe 422 that supplies the first deposition gas and a second gas supply pipe 423 that supplies the second deposition gas are housed in the shaft 421.

The shower plate 400 includes a first gas introduction passage 405 that is connected to the first gas supply pipe 422 and introduces the first deposition gas to the first passage 402 and a second gas introduction passage 415 that is connected to the second gas supply pipe 423 and introduces the second deposition gas to the second passage 412. Also, the shower plate 400 includes a plurality of first gas leading-out holes 406 that leads out the first deposition gas circulating in the first passage 402 and a plurality of second gas leading-out holes 416 that leads out the second deposition gas circulating in the second passage 412.

Next, a method of manufacturing the shower plate 400 will be described. FIGS. 12A to 12H are diagrams illustrating the method of manufacturing the shower plate 400. In the embodiment 4, an aluminum alloy is used as the material for the shower plate 400.

Figure 12A:
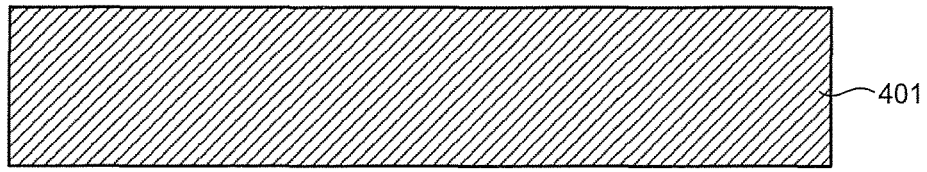
FIG. 12A is a diagram illustrating a process of forming a body plate in a method of manufacturing the shower plate illustrated in FIG. 11.

First, as illustrated in FIG. 12A, a bulk aluminum alloy is formed into a desired shape to produce the body plate 401.

Figure 12B:
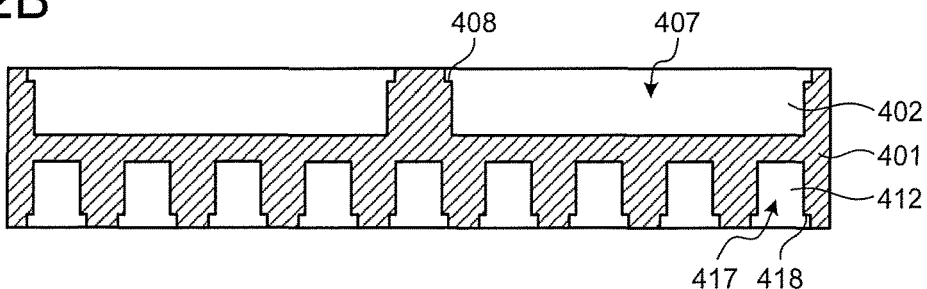
FIG. 12B is a diagram illustrating a process of forming a groove in the method of manufacturing the shower plate illustrated in FIG. 11.

Next, as illustrated in FIG. 12B, a groove 407 serving as the first passage 402 is formed in one of main surfaces of the body plate 401, and a support part 408 is formed by cutting off an edge of an opening of the groove 407. Also, a groove 417 serving as the second passage 412 is formed in the other of the main surfaces of the body plate 401, and a support part 418 is formed by cutting off an edge of an opening of the groove 417.

Figure 12C:
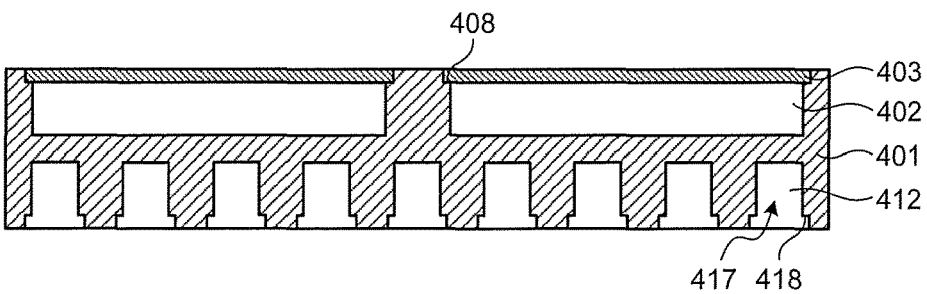
FIG. 12C is a diagram illustrating a process of forming a first passage in the method of manufacturing the shower plate illustrated in FIG. 11.
Figure 12D:
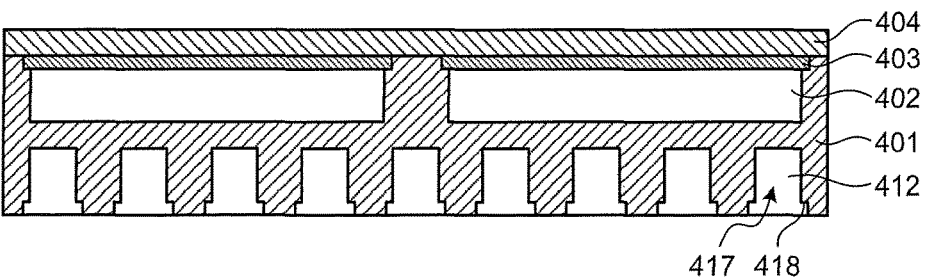
FIG. 12D is a diagram illustrating the process of forming a first passage in the method of manufacturing the shower plate illustrated in FIG. 11.

As illustrated in FIG. 12C, the cover plate 403 made of an aluminum alloy, which has an approximately equal shape to the opening of the groove 407 (for example, a similar figure) and has a larger area than the opening, is arranged on the support part 408. This plate is set in the holder 16 of the deposition apparatus 10, and aluminum alloy powder is poured into the powder supply unit 12, and the deposition is formed so as to cover the body plate 401 and the cover plate 403 by a cold spray method. Accordingly, the deposition layer 404 illustrated in FIG. 12D is formed.

Figure 12E:
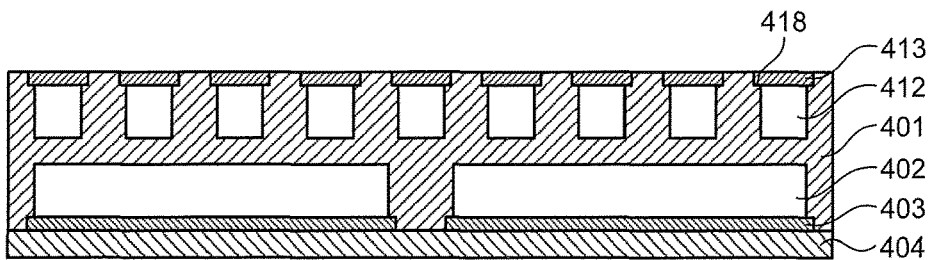
FIG. 12E is a diagram illustrating a process of forming a second passage in the method of manufacturing the shower plate illustrated in FIG. 11.
Figure 12F:
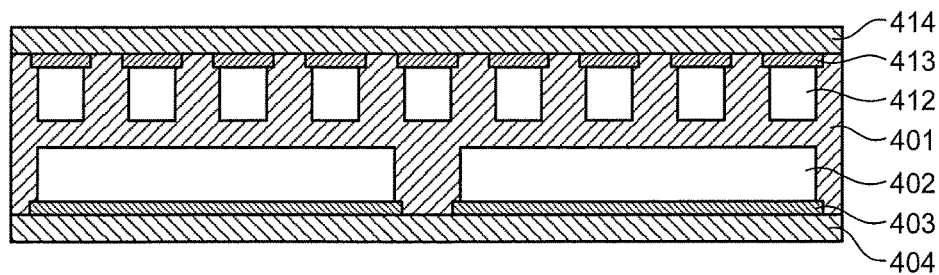
FIG. 12F is a diagram illustrating the process of forming a second passage in the method of manufacturing the shower plate illustrated in FIG. 11.

Next, as illustrated in FIG. 12E, the body plate 401 is turned upside down, and the cover plate 413 made of an aluminum alloy, which has an approximately equal shape to the opening of the groove 417 (for example, a similar figure) and has a larger area than the opening, is arranged on the support part 418. This plate is set in the holder 16 of the deposition apparatus 10 and the deposition is performed so as to cover the body plate 401 and the cover plate 413 by the cold spray method. Accordingly, the deposition layer 414 illustrated in FIG. 12F is formed.

Figure 12G:
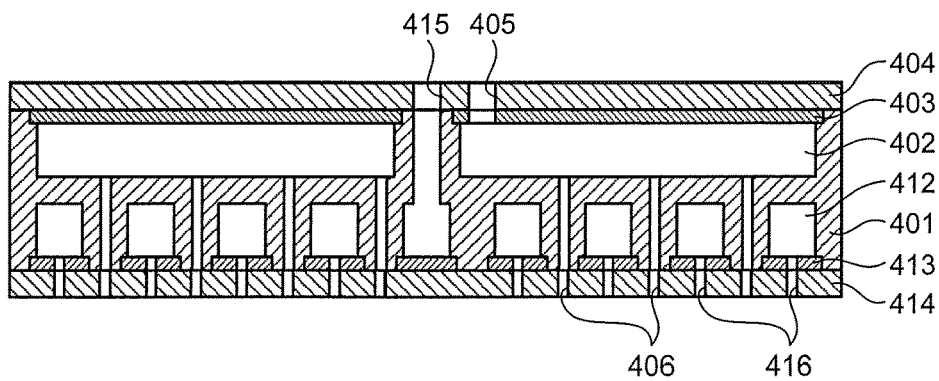
FIG. 12G is a diagram illustrating a process of forming a gas introduction passage and the like in the method of manufacturing the shower plate illustrated in FIG. 11.
Figure 12H:
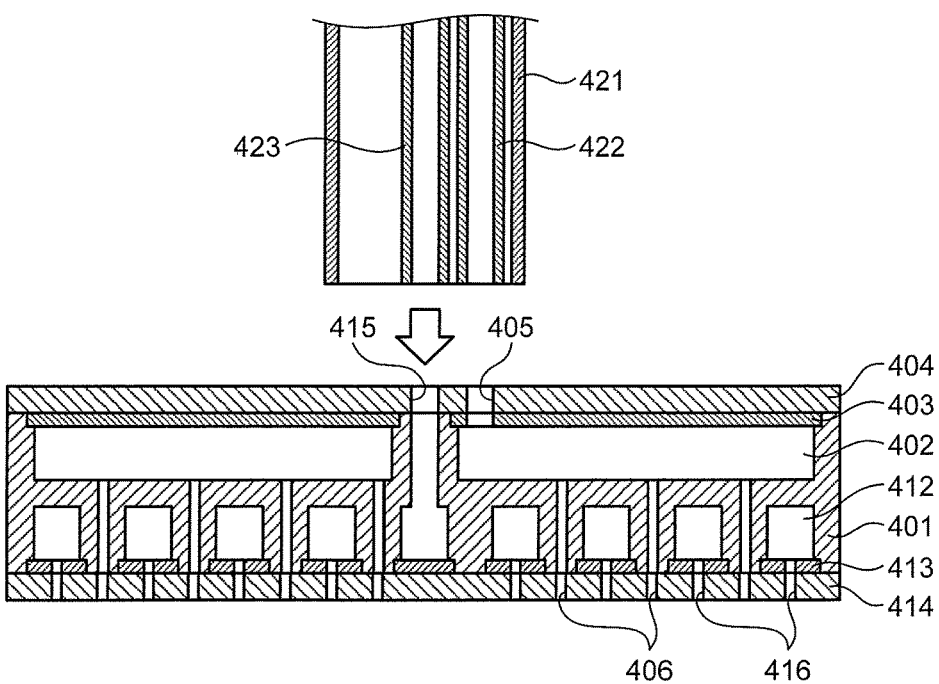
FIG. 12H is a diagram illustrating a process of joining a shaft and the like in the method of manufacturing the shower plate illustrated in FIG. 11.

Next, as illustrated in FIG. 12G, the first gas introduction passage 405 that penetrates the deposition layer 404 and the cover plate 403 from a surface side of the deposition layer 404 and is connected to the first passage 402 is formed. Similarly, the second gas introduction passage 415 that penetrates the deposition layer 404 and the body plate 401 and is connected to the second passage 412 is formed. Also, the plurality of first gas leading-out holes 406 that penetrates the deposition layer 414 and the body plate 401 from a surface side of the deposition layer 414 and is connected to the first passage 402 is formed. Similarly, the plurality of second gas leading-out holes 416 that penetrates the deposition layer 414 and the cover plate 413 and is connected to the second passage 412 is formed. Then, as illustrated in FIG. 12H, the first gas supply pipe 422 is connected to the first gas introduction passage 405 and the second gas supply pipe 423 is connected to the second gas introduction passage 415. Further, the shaft 421 is joined to the deposition layer 404 by means of electron beam welding and the like. Accordingly, the shower plate 400 illustrated in FIG. 11 is completed.

According to the fourth embodiment described above, the shower plate that secures the air tightness of the first and second passages 402 and 412 can be easily manufactured. Therefore, The shower plate 400 in this manner is used in a deposition chamber, mixture of the two types of deposition gases in the shower plate 400 and the leakage of the deposition gases outside the shower plate can be prevented.

Note that, in the fourth embodiment, the first and second gas introduction passages 405 and 415 are provided at the deposition layer 404 side, and the first and second gas leading-out holes 406 and 416 are provided at the deposition layer 414 side. However, the opposite may also be applicable. Also, the depths of the support parts 408 and 418 may be larger or smaller than the thicknesses of the cover plates 403 and 413, or the support parts 408 and 418 may not be provided.

REFERENCE SIGNS LIST

1 Powder
2 Substrate
3 Deposition layer
10 Deposition apparatus
11 Gas introduction pipe
11a and 11b Valve
12a Powder supply pipe
12 Powder supply unit
13a Gas piping
13 Heater
14 Chamber
15 Nozzle
16 Holder
100 Plate
101, 201, 301, and 401 Body plate
102, 111, 121, 131, and 202 Passage
103, 141, 203, 303, 313, 403, and 413 Cover plate
104, 204, 311, 321, 404, and 414 Deposition layer
105 Fluid introduction port
106 Fluid leading-out port
108 and 208 Cover plate placing surface
109, 306, 316, 407, and 417 Groove
200 Cold plate
205 Heating medium introduction passage
206 Heating medium leading-out passage
107, 207, 307, 317, 408, and 418 Support part
211, 331, and 421 Shaft
213 Coolant exhaust pipe
212 Coolant supply pipe
300 and 400 Shower plate
302 and 402 First passage
304 and 405 First gas introduction passage
305 and 406 First gas leading-out holes
312 and 412 Second passage
314 and 415 Second gas introduction passage
315 and 416 Second gas leading-out holes
332 and 422 First gas supply pipe
333 and 423 Second gas supply pipe

The invention claimed is:

1. A plate comprising:
a passage provided inside the plate and causing a fluid to circulate;
a body plate which is metal or an alloy, and in which a groove serving as the passage is provided;
a cover plate covering the groove;
a support part that is a cut-off portion formed on a surface of the body plate at an edge of the groove and to which the cover plate is fitted; and
a deposition layer formed by accelerating metal or alloy powder with a gas and spraying the powder on the body plate and the cover plate in a solid phase such that the deposition layer eats into a surface of the body plate and a surface of the cover plate at an interface between the body plate and the deposition layer and between the cover plate and the deposition layer, and covering the cover plate, wherein a depth of the support part is same as a thickness of the cover plate, and the deposition layer is formed on the surface of the cover plate which is an opposite side surface of a surface facing the passage.

2. The plate with the passage according to claim 1, wherein the deposition layer is formed by a cold spray method.

3. The plate with the passage according to claim 1, wherein each of the body plate, the cover plate, and the deposition layer is formed of any one of aluminum (Al), an aluminum alloy, titanium (Ti), a titanium alloy, stainless steel, copper (Cu), and a copper alloy.

4. The plate with the passage according to claim 3, wherein at least any one of the body plate, the cover plate, and the deposition layer is formed of a different metal or an different alloy from at least any one of or any two of the other body plate, cover plate, and deposition layer.

5. The plate with the passage according to claim 1, wherein the groove is formed in a first main surface of the body plate and, the plate further comprising a groove served as a second passage and formed in a second main surface that is an opposite side of the first main surface.

6. The plate with the passage according to claim 1, wherein a second groove serving as a second passage is formed in the deposition layer, and the plate further comprising:

a second cover plate covering the second groove; and a second deposition layer formed by accelerating metal or alloy powder with a gas and spraying the powder and the gas on the deposition layer and the second cover plate in a solid phase, and covering the second cover plate.

* * * * *